United States Patent
Han et al.

(10) Patent No.: US 9,265,140 B2
(45) Date of Patent: Feb. 16, 2016

(54) STRUCTURE FOR CONNECTING ELECTRICAL TRACE LINES OF PRINTED CIRCUIT BOARDS AND OPTICAL TRANSCEIVER MODULE WITH THE SAME

(71) Applicant: Electronics and Telecommunications Research Institute, Daejeon (KR)

(72) Inventors: Young-Tak Han, Daejeon (KR); Jang Uk Shin, Daejeon (KR); Sang Ho Park, Daejeon (KR); Yongsoon Baek, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 276 days.

(21) Appl. No.: 13/910,213

(22) Filed: Jun. 5, 2013

(65) Prior Publication Data

US 2014/0147128 A1    May 29, 2014

(30) Foreign Application Priority Data

Nov. 26, 2012   (KR) .................. 10-2012-0134665

(51) Int. Cl.
*H05K 7/00* (2006.01)
*H05K 1/18* (2006.01)
(Continued)

(52) U.S. Cl.
CPC ............. *H05K 1/0251* (2013.01); *H05K 1/141* (2013.01); *H05K 1/142* (2013.01); *H05K 1/144* (2013.01);
(Continued)

(58) Field of Classification Search
CPC ....... H05K 1/141; H05K 1/142; H05K 1/144; H05K 1/145; H05K 2201/04; H05K 2201/041; H05K 2201/042; H05K 2201/09209; H05K 2201/09218; H05K 2201/0929; H05K 2201/093

USPC ......... 361/748, 749, 760, 761, 764, 772, 777, 361/778, 782, 783, 784, 785, 789, 790, 791, 361/792

See application file for complete search history.

(56) References Cited

U.S. PATENT DOCUMENTS

| 2007/0134953 | A1* | 6/2007 | Morana et al. ............... 439/76.1 |
| 2009/0029570 | A1* | 1/2009 | Ikeuchi et al. ................. 439/67 |

(Continued)

FOREIGN PATENT DOCUMENTS

KR    10-2010-0005616 A    1/2010

OTHER PUBLICATIONS

Dongchurl Kim et al., "Design and Fabrication of a Transmitter Optical Subassembly (TOSA) in 10-Gb/s Small-Form-Factor Pluggable (XFP) Transceiver", IEEE Journal of Selected Topics in Quantum Electronics, Jul., Aug. 2006, pp. 776-782, vol. 12, No. 4.

(Continued)

*Primary Examiner* — Hoa C Nguyen
*Assistant Examiner* — Binh Tran
(74) *Attorney, Agent, or Firm* — Rabin & Berdo, P.C.

(57) ABSTRACT

Provided are structures for connecting trace lines of printed circuit boards and optical transceiver modules with the same. The module may include an optical transmitter/receiver part, a signal processing unit, a flexible PCB, and a rigid PCB. The flexible PCB may include a first signal line, and the rigid PCB may include a second signal line. The flexible PCB and the rigid PCB may be overlapped with each other. The first signal line and the second signal line may not be overlapped with each other and be electrically connected to each other by a junction soldering structure. It is possible to transmit high quality and high frequency signals through the first and second signal lines.

18 Claims, 6 Drawing Sheets

(51) Int. Cl.
*H05K 1/02* (2006.01)
*H05K 1/14* (2006.01)
*H05K 1/00* (2006.01)
*H05K 5/00* (2006.01)

(52) U.S. Cl.
CPC ............... *H05K 1/145* (2013.01); *H05K 1/181* (2013.01); *H05K 1/0219* (2013.01); *H05K 1/0221* (2013.01); *H05K 2201/09236* (2013.01); *H05K 2201/09618* (2013.01); *H05K 2201/09727* (2013.01); *H05K 2201/10121* (2013.01)

(56) References Cited

U.S. PATENT DOCUMENTS

2011/0121922 A1* 5/2011 Blair et al. .................... 333/238
2012/0032752 A1* 2/2012 Song et al. .................... 333/33

OTHER PUBLICATIONS

Tien-Tsorng Shih et al., "High-Performance Low-Cost 10-Gb/s Coaxial DFB Laser Module Packaging by Conventional TO-Can Materials and Processes", IEEE Journal of Selected Topics in Quantum Electronics, Sep./Oct. 2006, pp. 1009-1016, vol. 12, No. 5.

Daniel Long, "Considerations for PCB Layout and Impedance Matching Design in Optical Modules", Texas Instruments, Feb. 2011, pp. 1-12.

"Physical Interface of LC TOSA Type 1 Package", Multi-source Agreement (MSA) of 10 Gbit/s Miniature Device (XMD), Rev. 2.1, Jan. 2006, pp. 1-9.

"Physical Interface of LC TOSA Type 2 Package", Multi-source Agreement (MSA) of 10 Gbit/s Miniature Device (XMD), Rev. 2.1, Jan. 2006, pp. 1-9.

* cited by examiner

STRUCTURE FOR CONNECTING ELECTRICAL TRACE LINES OF PRINTED CIRCUIT BOARDS AND OPTICAL TRANSCEIVER MODULE WITH THE SAME

CROSS-REFERENCE TO RELATED APPLICATIONS

This U.S. non-provisional patent application claims priority under 35 U.S.C. §119 to Korean Patent Application No. 10-2012-0134665, filed on Nov. 26, 2012, in the Korean Intellectual Property Office, the entire contents of which are hereby incorporated by reference.

BACKGROUND OF THE INVENTION

Example embodiments of the inventive concept relate to an optical transceiver module, and in particular, to structures for connecting trace lines of printed circuit boards and optical transceiver modules with the same.

With the widespread usage of internet and media contents, there is an increasing interest on optical transmission/reception systems capable of transmitting a large capacity of voice and video signals at high speed. Conventionally, in 10 Gbps optical transmitter/receiver modules applied for the high-speed optical transmission/reception system, a flexible printed circuit board (PCB) is used outside of an optical module package to transmit high frequency RF signals. The flexible PCB is electrically connected to other PCB for operating the optical transmitter/receiver module. Most of transmission lines on the flexible PCB are configured to have a ground electrode provided below a signal electrode or be a grounded coplanar waveguide (GCPW) type.

When the transmission lines on the flexible PCB are connected to soldering pads of a PCB, a lower electrode of the flexible PCB is partially removed at a position of the soldering pad and be configured to have a CPW structure that via holes are formed in a signal electrode. Since a lower ground electrode is not used to connect the flexible PCB with the PCB, the soldering pad of the flexible PCB may have an increased inductance, and thus, high frequency signals may be seriously reflected by characteristic impedance mismatch. The reflection of high frequency signals may deteriorate transmission quality of optical signals.

SUMMARY

Example embodiments of the inventive concept provide an electrical connection structure with a reduced characteristic impedance mismatch and an optical transceiver module with the same.

Other example embodiments of the inventive concept provide an electrical connection structure configured to reduce reflection of high frequency signals and an optical transmitter/receiver module with the same.

According to example embodiments of the inventive concepts, an electrical connection structure may include a first board body, a first signal line extending along a first direction on the first board body, first ground lines provided spaced apart from each other at both sides of the first signal line on the first board body to extend along the first direction, via ground lines connected to the first ground lines through the first board body, a ground plate provided below the first board body and connected to the via ground lines, a second board body overlapped with the first board body, second ground lines provided on the second board body and connected to the ground plate, the second ground lines extending along the first direction, a second signal line provided between the second ground lines on the second board body to extend along the first direction, the first and second signal lines being not overlapped with each other, and a first junction soldering connecting the second signal line with the first signal line.

In example embodiments, the first board body may include a first margin region provided near a first edge thereof, and the ground plate may be provided out of the first margin region. A width of the first margin region may be 50 µm, when measured from the first edge.

In example embodiments, the second board body may include a second margin region provided between the second ground lines, and the second signal line may be provided out of the second margin region.

In example embodiments, a length of the margin region ranges from 700 µm to 1400 µm, when measured from a second edge of the second board body.

In example embodiments, the first junction soldering may include at least one of a solder paste, a silver paste, or a bonding wire.

In example embodiments, the electrical connection structure may further include an upper cover layer provided on the first board body to cover the first ground lines and the first signal line, and a lower cover layer provided below the first board body to cover the ground plate.

In example embodiments, the first ground lines and the second ground lines have first via holes and second via holes, respectively. The electrical connection structure may further include a second junction soldering filling the first and second via holes. The first via holes and the second via holes may be aligned on the second board body, and the second junction soldering connects the first ground lines with the second ground lines.

In example embodiments, the first board body may include a dielectric layer. For example, the dielectric may include polyimide or teflon.

In example embodiments, the second board body may include a polymeric dielectric material.

According to example embodiments of the inventive concepts, an optical transceiver module may include an optical transmitter/receiver part, a signal processing unit configured to process electrical signals to be transmitted to or received from the optical transmitter/receiver part, a first board body fixed to the optical transmitter/receiver part, a first signal line extending along a first direction on the first board body, first ground lines provided spaced apart from each other at both sides of the first signal line on the first board body to extend from the optical transmitter/receiver part along the first direction, via ground lines connected to the first ground lines through the first board body, a ground plate provided below the first board body and connected to the via ground lines, a second board body overlapped with the first board body to fix the signal processing unit, second ground lines provided on the second board body and connected to the ground plate, the second ground lines extending along the first direction, a second signal line provided between the second ground lines on the second board body to extend along the first direction, the second signal line being not overlapped with the first signal line, and a junction soldering connecting the second signal line with the first signal line.

In example embodiments, the optical transmitter/receiver part may include at least one of a laser diode or a photodiode.

In example embodiments, the signal processing unit may include at least one of a laser diode driver, an optical modulator driver, a pre-amplifier, a post-amplifier, or a clock-and-data recovery (CDR) circuit.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
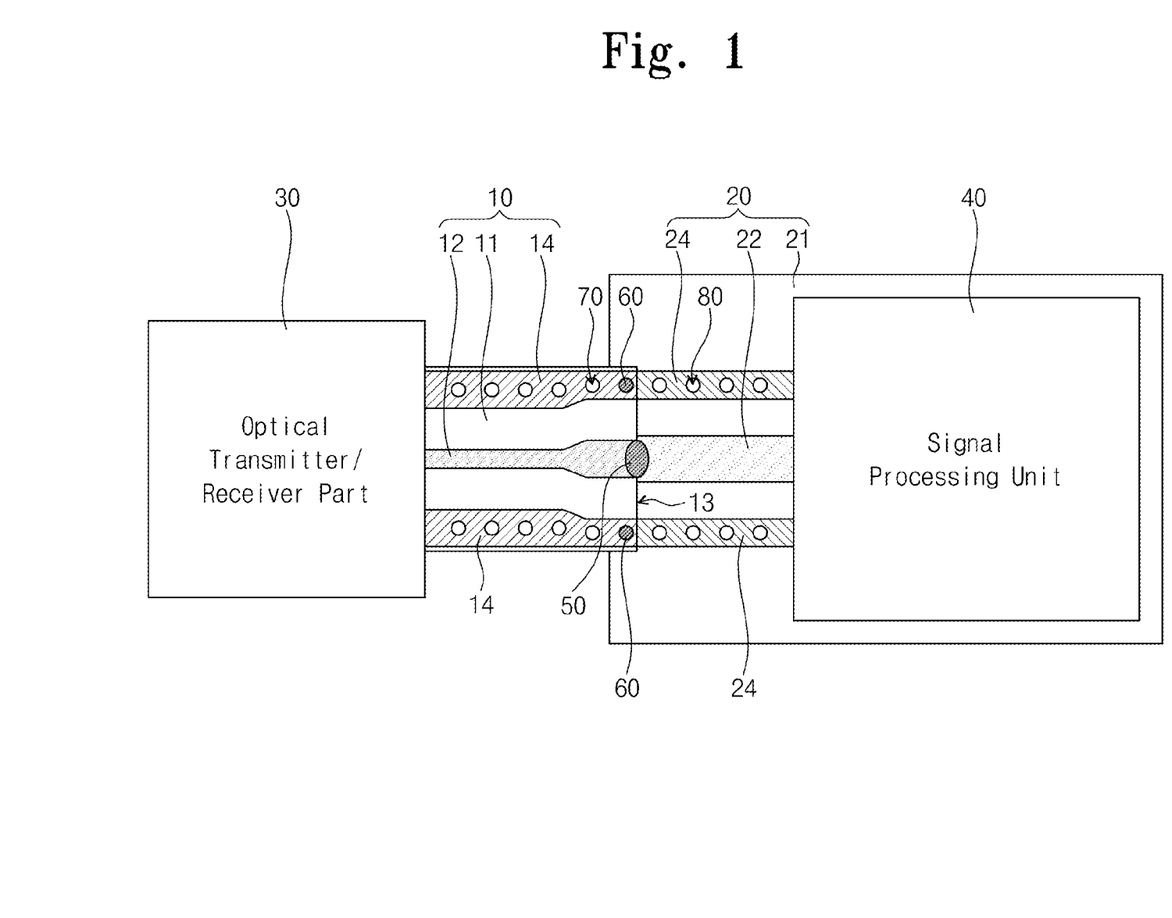
FIG. 1 is a plan view illustrating a transceiver module according to example embodiments of the inventive concept.

FIG. 1 is a plan view illustrating an optical transceiver module according to example embodiments of the inventive concept.

Referring to FIG. 1, the optical transceiver module, according to example embodiments of the inventive concept, may include an optical transmitter/receiver part 30, a signal processing unit 40, a flexible printed circuit board (PCB) 10, and a rigid PCB 20.

The optical transmitter/receiver part 30 may include an optical receiver or an optical transmitter, such as a photodiode and a laser diode. The optical receiver may be configured to output high frequency receiving signals to the signal processing unit 40. The optical transmitter may be configured to input high frequency transmitting signals from the signal processing unit 40. The signal processing unit 40 may include at least one of a laser diode driver, an optical modulator driver, a pre-amplifier, a post-amplifier, or a clock-and-data recovery (CDR) circuit.

The flexible PCB 10 and the rigid PCB 20 may be configured in such a way that high frequency signals can be transmitted between the optical transmitter/receiver part 30 and the signal processing unit 40. The optical transmitter/receiver part 30 may be fixed to the flexible PCB 10. The signal processing unit 40 may be fixed to the rigid PCB 20. At least a portion of the flexible PCB 10 may be overlapped with the rigid PCB 20.

The flexible PCB 10 and the rigid PCB 20 may include a first signal line 12 and a second signal line 22, respectively, which may be electrically connected by a first junction soldering 50. The first junction soldering 50 may be provided at a first edge 13 of the flexible PCB 10 and on the second signal line 22 of the rigid PCB 20. First via holes 70 and second via holes 80 may be provided in the flexible PCB 10 and the rigid PCB 20, respectively. First ground lines 14 and second ground lines 24 may be connected to each other by second junction solderings 60.

Figure 2:
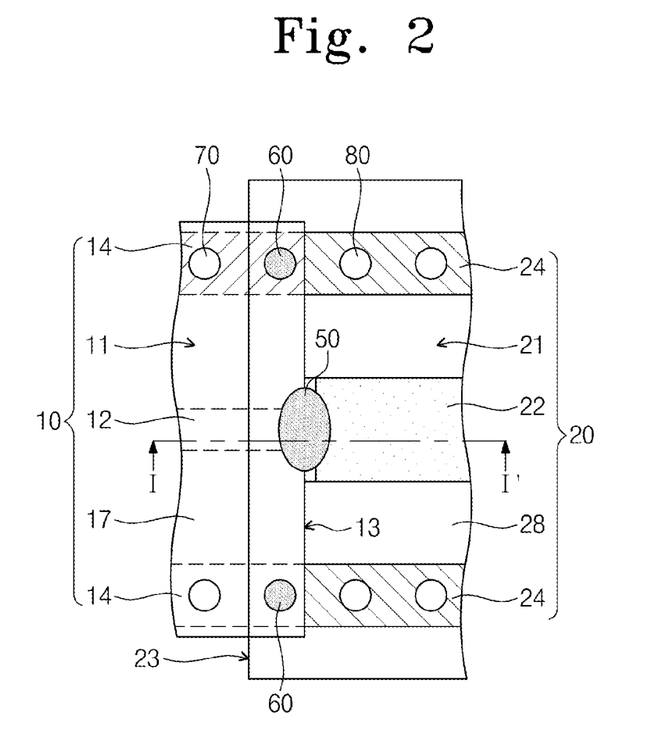
FIG. 2 is a plan view illustrating a connection portion between the flexible and rigid PCBs of FIG. 1.
Figure 3:
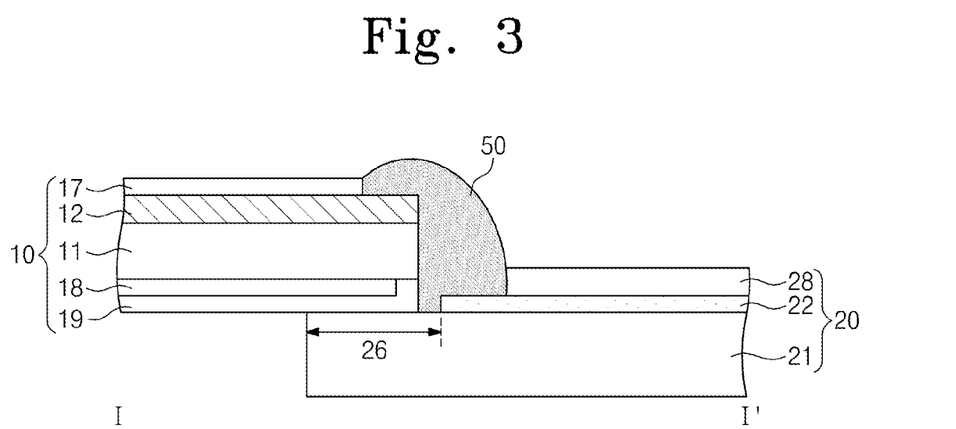
FIG. 3 is a sectional view taken along the line I-I' of FIG. 2.
Figure 4:
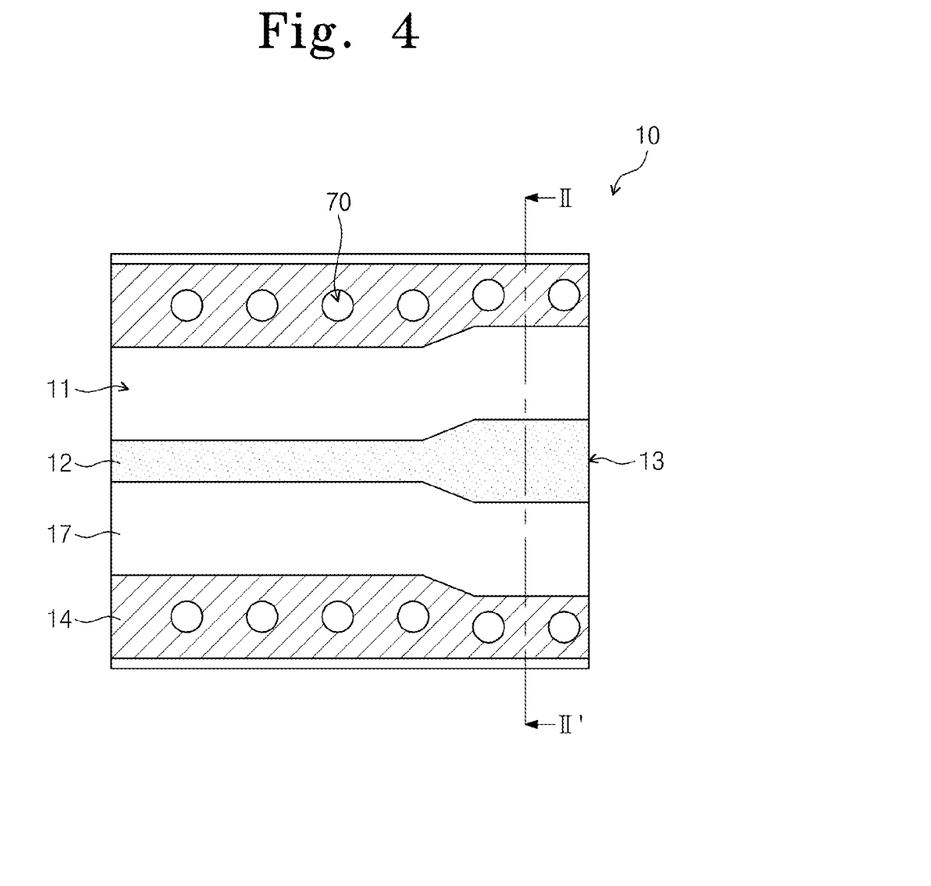
FIGS. 4 and 5 are plan views illustrating top and bottom portions, respectively, of the flexible PCB.
Figure 5:
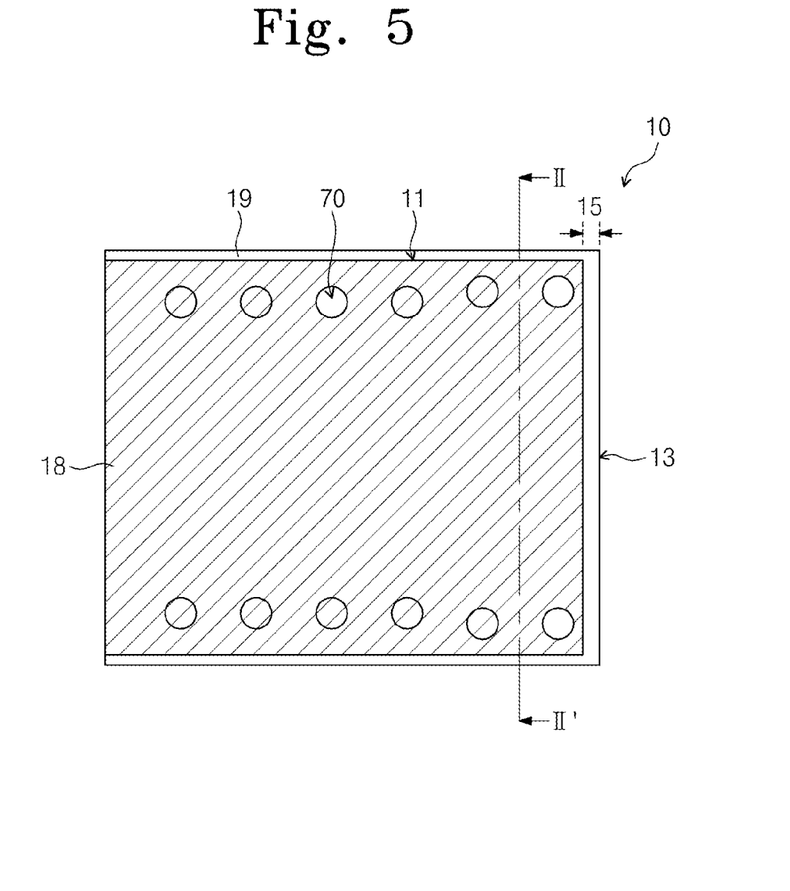
Figure 6:
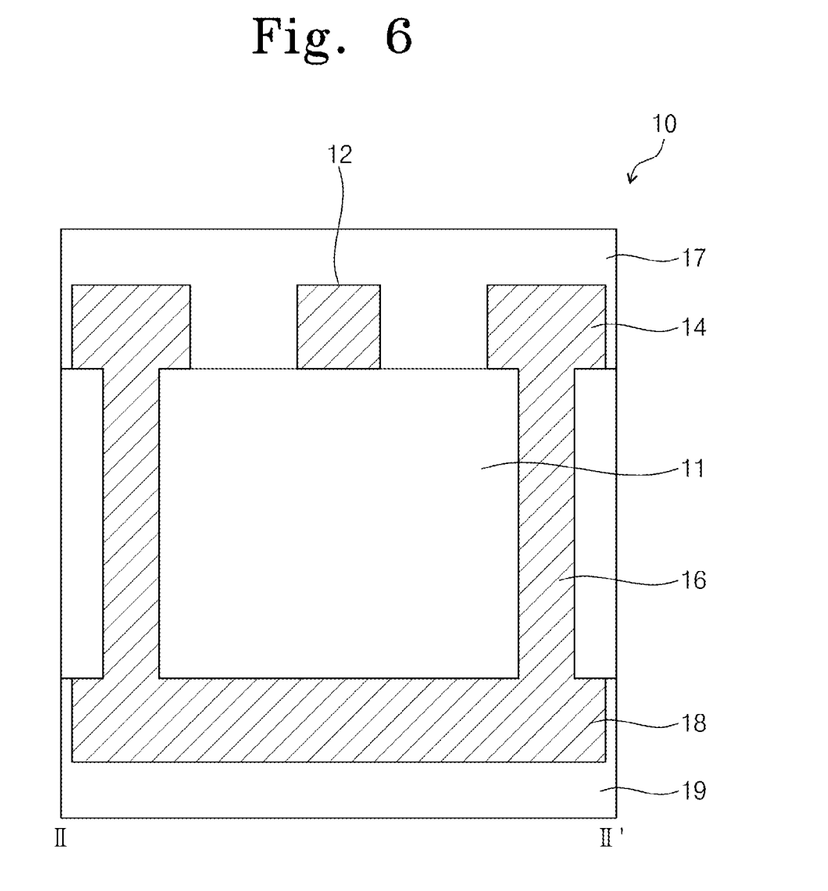
FIG. 6 is a sectional view taken along the line II-II' of FIGS. 4 and 5.

FIG. 2 is a plan view illustrating a connection portion between the flexible and rigid PCBs 10 and 20 of FIG. 1. FIG. 3 is a sectional view taken along the line I-I' of FIG. 2. FIGS. 4 and 5 are plan views illustrating top and bottom portions, respectively, of the flexible PCB 10. FIG. 6 is a sectional view taken along the line II-II' of FIGS. 4 and 5.

Referring to FIGS. 1 through 6, the flexible PCB 10 may include a flexible PCB body 11, a first signal line 12, first ground lines 14, via ground lines 16, a first upper cover layer 17, a ground plate 18, and a first lower cover layer 19.

The flexible PCB body 11 may include a bulk dielectric, such as polyimide or teflon. The bulk dielectric may be elastically bent, when an external force is exerted thereto. Further, the bulk dielectric may be provided to have a thickness of about 50 μm to 80 μm. The polyimide for the flexible PCB body 11 may have a dielectric constant of about 3.0 to 3.5. The teflon for the flexible PCB body 11 may have a dielectric constant of about 2.6 to 3.0.

The first signal line 12 and the first ground lines 14 may be connected to the optical transmitter/receiver part 30. The first signal line 12 and the first ground lines 14 may extend along a first direction, on the flexible PCB body 11. The first signal line 12 may be provided between the first ground lines 14. The first signal line 12 and the first ground lines 14 may have a thickness of about 10 m to 40 μm. The first signal line 12 may have a line width ranging from about 60 μm to about 120 μm. The first ground lines 14 may be provided to have the first via holes 70. The first via holes 70 may have a diameter of about 200 μm or less. In addition, the first via holes 70 may be provided in such a way that a pitch therebetween ranges from about 700 μm to 1000 μm. The first ground lines 14 may be connected to the via ground lines 16. The via ground lines 16 may be provided to penetrate the flexible PCB body 11. The via ground lines 16 may be connected to the ground plate 18.

The ground plate 18 may be provided below the flexible PCB body 11. The first ground lines 14, the via ground lines 16, and the ground plate 18 may be configured to serve as a Ground CoPlanar Waveguide (GCPW)-type transmission line with respect to the first signal line 12.

The flexible PCB body 11 may include a first margin region 15, on which the ground plate 18 is not provided. A length of the first margin region 15 may be about 50 μm, when measured from the first edge 13 of the flexible PCB body 11. The ground plate 18 may be provided out of the first margin region 15. The first edge 13 may be a section of the flexible PCB body 11 that is located at end portions of the first signal line 12 and the first ground lines 14.

Although not shown, the ground plate 18 may be electrically separated from the first signal line 12 and the first junction soldering 50, which is provided on the second signal line 22, by the first margin region 15. By virtue of the presence of the first margin region 15, it is possible to prevent a short circuit from being generated between the ground plate 18 and the first junction soldering 50.

The first upper cover layer 17 may be provided to cover the first signal line 12 and the first ground lines 14 provided on the flexible PCB body 11. A portion of the first upper cover layer 17 located below the first junction soldering 50 may be removed. The first lower cover layer 19 may cover the ground plate 18 provided below the flexible PCB body 11. The first upper cover layer 17 and the first lower cover layer 19 may include a dielectric film (e.g., of polyimide or teflon).

Figure 7:
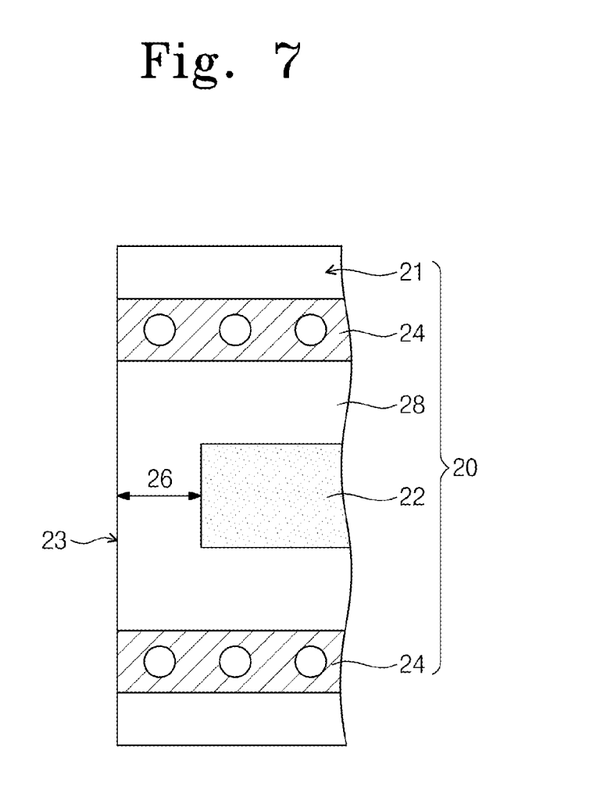
FIG. 7 is a plan view illustrating a portion of the rigid PCB of FIG. 2.

FIG. 7 is a plan view illustrating a portion of the rigid PCB 20 of FIG. 2.

Referring to FIGS. 1, 2, 3, and 7, the rigid PCB 20 may include a rigid PCB body 21, a second signal line 22, second ground lines 24, and a second upper cover layer 28. The rigid PCB body 21 may have a larger area than the flexible PCB body 11. The rigid PCB body 21 may include a polymeric dielectric material. The second signal line 22 and the second ground lines 24 may extend along the first direction on the rigid PCB body 21. The second ground lines 24 may be provided at both sides of the second signal line 22. The second ground lines 24 may be provided to have the second via holes 80. The second via holes 80 may be configured to have the same size and pitch as those of the first via holes 70. The second signal line 22 and the second ground lines 24 on the rigid PCB 20 may be connected to the signal processing unit 40. The rigid PCB body 21 may be provided to have a second margin region 26. The second margin region 26 may be provided between the second ground lines 24. The second margin region 26 may refer to a region, where the second signal line 22 is not provided. The second signal line 22 may be shorter than the second ground lines 24. For example, a length of the second margin region 26 may range from about 700 μm to 1400 μm, when measured from a second edge 23 of the rigid PCB body 21. The second edge 23 may be a section or side surface of the rigid PCB body 21 that is located at end portions of the second ground lines 24.

The ground plate 18 may be provided on the second margin region 26, when the flexible PCB 10 is connected to the rigid PCB 20. Accordingly, the second margin region 26 makes it possible to prevent a short circuit from being generated between the second signal line 22 and the ground plate 18. The second upper cover layer 28 may be provided to cover the second signal line 22, the second ground lines 24, and the rigid PCB body 21.

the first ground lines 14 may be overlapped with the second ground lines 24. The first via holes 70 may be aligned with the second via holes 80. As described above, the second junction soldering 60 may be provided to fill the first via holes 70 and the second via holes 80. Due to the presence of the second junction soldering 60, it is possible to enhance a mechanical joint strength between the flexible PCB body 11 and the rigid PCB body 21. The second junction soldering 60 may be bonded to the ground plate 18.

The first signal line 12 and the second signal line 22 may be electrically connected to each other by the first junction soldering 50, even when they are not overlapped with each other. The first junction soldering 50 may include at least one of a solder paste, a silver paste, or a bonding wire. End portions of the first and second signal lines 12 and 22 provided under the first junction soldering 50 may serve as signal line soldering pads. The signal line soldering pads may not be overlapped with each other and be provided spaced apart from each other. Since the first signal line 12 and the second signal line 22 may be separated from each other, it is possible to achieve low inductance and capacitance, compared to the conventional case that transmission lines are overlapped to each other. Accordingly, it is possible to transmit high quality and high frequency signals through the first and second signal lines 12 and 22. In addition, it is possible to match effectively characteristic impedance of high frequency signals going through the first signal line 12 and the second signal line 22. In other words, the optical transceiver module according to example embodiments of the inventive concept can be configured to reduce the mismatch of characteristic impedance and reflection of high frequency signals.

According to example embodiments of the inventive concept, an optical transceiver module may include an optical transmitter/receiver part, a signal processing unit, a flexible PCB, and a rigid PCB. The flexible PCB may include a first signal line, and the rigid PCB may include a second signal line. In addition, the flexible PCB and the rigid PCB may be overlapped with each other. The first signal line and the second signal line may not be overlapped with each other and be electrically connected to each other by a junction soldering structure. Since the first signal line and the second signal line may not be overlapped with each other, it is possible to achieve low inductance and capacitance, compared to the conventional case that transmission lines are overlapped to each other. Accordingly, it is possible to transmit high quality and high frequency signals through the first and second signal lines.

Accordingly, the optical transceiver module according to example embodiments of the inventive concept can be configured to reduce the mismatching of characteristic impedance and reflection of high frequency signals.

While example embodiments of the inventive concepts have been particularly shown and described, it will be understood by one of ordinary skill in the art that variations in form and detail may be made therein without departing from the spirit and scope of the attached claims.

What is claimed is:

1. An electrical connection structure, comprising: a first board body; a first signal line extending along a first direction on the first board body; first ground lines provided spaced apart from each other at two opposite sides of the first signal line to be on the first board body to extend along the first direction; via ground lines connected to the first ground lines through the first board body; a ground plate provided below the first board body and connected to the via ground lines; a second board body overlapped with the first board body; second ground lines provided on the second board body and connected to the ground plate, the second ground lines extending along the first direction; a second signal line provided between the second ground lines to be on the second board body to extend along the first direction, the first and second signal lines being not overlapped with each other; and a first junction soldering connecting the second signal line with the first signal line; wherein the first board body comprises a first margin region provided near a first edge thereof, and the ground plate is provided completely outside of the first margin region, wherein the second board body comprises a second margin region provided between the second ground lines, in a plan view the second margin region has an end at a second edge of the second board body that the second ground lines are disposed on, and the second signal line is provided completely outside of the second margin region so that the second signal line is away from and not directly on any of the entire second edge of the second board body that the second ground lines are disposed on, wherein the first margin region overlaps with the second margin region.

2. The electrical connection structure of claim 1, wherein the first board body comprises a first margin region provided near a first edge thereof, and the ground plate is provided out of the first margin region.

3. The electrical connection structure of claim 2, wherein a width of the first margin region is 50 μm, when measured from the first edge.

4. The electrical connection structure of claim 1, wherein the second board body comprises a second margin region provided between the second ground lines, and the second signal line is provided out of the second margin region.

5. The electrical connection structure of claim 4, wherein a length of the second margin region ranges from 700 μm to 1400 μm, when measured from a second edge of the second board body.

6. The electrical connection structure of claim 1, wherein the first junction soldering comprises at least one of a solder paste, a silver paste, or a bonding wire.

7. The electrical connection structure of claim 1, further comprising:
   an upper cover layer provided on the first board body to cover the first ground lines and the first signal line; and
   a lower cover layer provided below the first board body to cover the ground plate.

8. The electrical connection structure of claim 1, wherein the first ground lines and the second ground lines have first via holes and second via holes, respectively.

9. The electrical connection structure of claim 8, further comprising a second junction soldering filling the first and second via holes,
   wherein the first via holes and the second via holes are aligned on the second board body, and
   the second junction soldering connects the first ground lines with the second ground lines.

10. The electrical connection structure of claim 1, wherein the first board body comprises a dielectric layer.

11. The electrical connection structure of claim 10, wherein the dielectric comprises polyimide or teflon.

12. The electrical connection structure of claim 1, wherein the second board body comprises a polymeric dielectric material.

13. The electrical connection structure of claim 1, wherein the ground plate overlaps the second margin region.

14. An optical transceiver module, comprising: an optical transmitter or receiver part; a signal processing unit configured to process electrical signals to be transmitted to or received from the optical transmitter or receiver part; a first board body fixed to the optical transmitter or receiver part; a first signal line provided on the first board body to extend from the optical transmitter or receiver part along a first direction; first ground lines provided spaced apart from each other at two opposite sides of the first signal line to be on the first board body to extend from the optical transmitter or receiver part along the first direction; via ground lines connected to the first ground lines through the first board body; a ground plate provided below the first board body and connected to the via ground lines; a second board body overlapped with the first board body to fix the signal processing unit; second ground lines provided on the second board body and connected to the ground plate, the second ground lines extending along the first direction; a second signal line provided between the second ground lines on the second board body to extend along the first direction, the second signal line being not overlapped with the first signal line; and a junction soldering connecting the second signal line with the first signal line; wherein the first board body comprises a first margin region provided near a first edge thereof, and the ground plate is provided completely outside of the first margin region, wherein the second board body comprises a second margin region provided between the second ground lines, in a plan view the second margin region has an end at a second edge of the second board body that the second ground lines are disposed on, and the second signal line is provided completely outside of the second margin region so that the second signal line is away from and not directly on any of the entire second edge of the second board body that the second ground lines are disposed on, wherein the first margin region overlaps with the second margin region.

15. The optical transceiver module of claim 14, wherein the optical transmitter or receiver part comprises at least one of laser diode or photodiode.

16. The optical transceiver module of claim 14, wherein the signal processing unit comprises at least one of a laser diode driver, an optical modulator driver, a pre-amplifier, a post-amplifier, or a clock-and-data recovery (CDR) circuit.

17. The optical transceiver module of claim 14, wherein the ground plate overlaps the second margin region.

18. The optical transceiver module of claim 14, wherein the second signal line is shorter than the second ground lines.

* * * * *